(12) United States Patent
Jung (10) Patent No.: US 7,977,035 B2
(45) Date of Patent: Jul. 12, 2011

(54) METHOD FOR FORMING FINE PATTERN OF SEMICONDUCTOR DEVICE

(75) Inventor: Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 1230 days.

(21) Appl. No.: 11/617,445

(22) Filed: Dec. 28, 2006

(65) Prior Publication Data

US 2008/0076072 A1 Mar. 27, 2008

(30) Foreign Application Priority Data

Sep. 8, 2006 (KR) .................. 10-2006-0086873

(51) Int. Cl.
*G03F 7/20* (2006.01)
(52) U.S. Cl. ........................................ 430/313
(58) Field of Classification Search .................. 430/311, 430/313, 322
See application file for complete search history.

(56) References Cited

U.S. PATENT DOCUMENTS

| | | | |
|---|---|---|---|
| 6,605,412 B2 | 8/2003 | Iwata et al. | |
| 2003/0170563 A1* | 9/2003 | Jung et al. | 430/270.1 |
| 2006/0141243 A1* | 6/2006 | Ibuki | 428/334 |
| 2006/0216649 A1* | 9/2006 | Paxton et al. | 430/311 |
| 2006/0234166 A1* | 10/2006 | Lee et al. | 430/313 |
| 2006/0292501 A1* | 12/2006 | Shih | 430/322 |
| 2007/0020565 A1* | 1/2007 | Koh et al. | 430/313 |
| 2007/0123037 A1 | 5/2007 | Lee et al. | |
| 2007/0178404 A1* | 8/2007 | Brodsky et al. | 430/270.1 |

FOREIGN PATENT DOCUMENTS

| | | |
|---|---|---|
| TW | 515007 | 12/2002 |
| TW | 548789 | 8/2003 |
| TW | 1230976 | 4/2005 |
| WO | PCT/WO2005/034216 A1 | 4/2005 |

* cited by examiner

*Primary Examiner* — Kathleen Duda
*Assistant Examiner* — Brittany Raymond
(74) *Attorney, Agent, or Firm* — Kilpatrick Townsend & Stockton LLP (57) ABSTRACT

A method for manufacturing a fine pattern of a semiconductor device comprising: forming hard mask patterns having a thickness of $t_1$ over an underlying layer; forming a light penetrable thin film having a thickness of $t_2$ over the hard mask pattern; forming a light absorbable thin film over light penetrable thin film; performing an exposure process on the resulting structure without use of an exposure mask while controlling an amount of exposure energy such that an exposure light reaches a depth T measured from a top surface of the light penetrable thin film to a top surface of the underlying layer such that $t_2 < T \leq t_1 + t_2$; performing a developing process on the resulting structure to form an organic mask pattern between the hard mask patterns; and etching the underlying layer using the hard mask pattern and the organic mask pattern as an etching mask to form an underlying layer pattern.

17 Claims, 6 Drawing Sheets

METHOD FOR FORMING FINE PATTERN OF SEMICONDUCTOR DEVICE

CROSS-REFERENCES TO RELATED APPLICATIONS

The present application claims priority to Korean patent application number 10-2006-86763, filed on Sep. 8, 2006, which is incorporated by reference in its entirety.

BACKGROUND OF THE INVENTION

The present invention relates to a method for manufacturing a semiconductor device.

In order to manufacture semiconductor devices that have been getting smaller, patterns have also become smaller. Research has been made to develop resist and exposers for obtaining fine patterns.

In exposers, although KrF (at 248 nm) or ArF (at 193 nm) as an exposure light source have been applied to exposure process, attempts have been made to use short wavelength light sources such as $F_2$ (at 157 nm) or EUV (at 13 nm) to increase numerical apertures (NA).

However, when new light sources such as $F_2$ or EUV are applied, a new exposer is required, which results in increasing manufacturing costs. Also, the increase of numerical apertures degrades a focus depth width.

Recently, an immersion lithography process has been developed with an immersion solution having a high refractive index. However, it is difficult to apply the immersion lithography process to mass production.

Although fine patterns having a resolution beyond lithography limits are formed by a dual exposure method, it is difficult to secure margins of overlapping and arrangement degrees, which results in excessive consumption of cost and process time.

BRIEF SUMMARY OF THE INVENTION

Embodiments of the present invention provide a method for forming a fine pattern having a pitch beyond lithography limits with an exposer and an organic polymer film having a dual deposition structure.

In one embodiment of the present invention, a method for manufacturing a fine pattern of a semiconductor device comprises: forming a hard mask pattern having a thickness of $t_1$ over a semiconductor substrate including an underlying layer; forming a light penetrable thin film over the resulting structure in a conformal manner at a thickness of $t_2$; forming a light absorbable thin film over the resulting structure in a planar manner; performing an exposure process on the resulting structure without the use of an exposure mask while controlling an amount of the exposure energy such that an exposure light reaches a depth of T measured from a top surface of the light penetrable thin film disposed over the hard mask pattern to a top surface of the underlying layer such that $t_2 < T \leq t_1 + t_2$; performing a developing process on the resulting structure to form organic mask patterns disposed between the hard mask patterns, the organic mask patterns formed of a stack pattern of the light penetrable thin film and the light absorbable thin film; and etching the underlying layer using the hard mask pattern and the organic mask pattern as an etching mask to form an underlying layer pattern.

The method may further comprise repeatedly performing two or more times the forming-the-light-penetrable-thin-film step through the performing-a-developing-process step.

The pitch between the hard mask patterns obtained from the forming-a-hard-mask step is approximately A, and the pitch between the hard mask pattern and the organic mask pattern that are obtained from the performing-a-developing-process step is approximately A/2.

The hard mask pattern may be formed of a material selected from the group consisting of polysilicon, an oxide film, a nitride film, a metal, and combinations thereof.

The light penetrable thin film is formed by using a composition comprising an organic polymer compound penetrable by a light of approximately 193 nm, a photoacid generator, and an organic solvent. The light-penetrable-thin-film-forming step comprises: applying the composition over a substrate; and baking the composition at approximately 90° C. to approximately 150° C. for approximately 30 seconds to approximately 180 seconds. In some embodiments, the organic polymer is poly(t-butyl acrylate/maleic anhydride/t-butyl 5-norbornene-2-carboxylate/2-hydroxyethyl 5-norbornene-2-carboxylate). The organic solvent is selected from the group consisting of methyl 3-methoxypropionate, ethyl 3-ethoxypropionate, propyleneglycol methyl ether acetate, cyclohexanone, 2-heptanone, n-butanol, and ethylactate.

The light absorbable thin film is formed by using a composition comprising an organic polymer compound absorbable by a light of approximately 193 nm, a photoacid generator, and an organic solvent. The light-absorbable-thin-film-forming step comprises: applying the composition over a substrate; and baking the composition at approximately 90° C. to approximately 150° C. for approximately 30 seconds to approximately 180 seconds. The organic polymer compound may include an aromatic group. The organic polymer compound is poly(acrylic acid/2,2,3,4,4,4-hexafluorobutyl methacrylate/t-butyl acrylate/styrene).

In some embodiments, the organic solvent is a $C_4$-$C_8$ alcohol compound selected from the group consisting of 1-butanol, 2-butanol, 2-methyl-1-propanol, 1-pentanol, 2-pentanol, 3-pentanol, 2-methyl-1-butanol, 3-methyl-1-butanol, 1,2-dimethyl-1-propanol, 1-hexanol, 2-hexanol, 3-hexanol, 2-methyl pentanol, 3-methyl pentanol, 4-methyl pentanol, 1,3-dimethylbutanol, 1,2-dimethylbutanol, heptanol, and octanol.

In some embodiments, the exposure process without the use of an exposure mask is performed with an exposure energy ranging from approximately 10 mJ/cm² to approximately 200 mJ/cm².

The underlying layer is formed of a material selected from the group consisting of a word line forming material, a bit line forming material, and a metal line forming material.

The forming-a-hard-mask-pattern step includes: forming a hard mask layer over the underlying layer; forming a photoresist film over the hard mask layer; performing an exposure and developing processes on the photoresist film with an exposure mask to form a photoresist pattern; etching the hard mask layer using the photoresist pattern as a mask to form a hard mask pattern; and removing the photoresist pattern.

In another embodiment, a method for manufacturing a fine pattern of a semiconductor device includes forming a hard mask pattern having a first pitch and a thickness of $t_1$ over an underlying layer, the hard mask pattern including a first structure and a second structure, the underlying layer disposed over a semiconductor substrate. A light penetrable thin film having a thickness of $t_2$ is formed over the hard mask pattern and the underlying layer. A light absorbable thin film is formed over the light penetrable thin film, the light absorbable thin film having a substantially planar upper surface. An exposure process is performed on the light absorbable thin film, the light penetrable thin film, and the hard mask pattern without using an exposure mask, the exposure process involving controlling an amount of exposure energy such that a light reaches to a depth T measured from a top surface of the light penetrable thin film disposed over the hard mask patterns to a top surface of the underlying layer, wherein $t_2 < T \leq t_1 + t_2$. Thereafter, a developing process is performed to form an additional pattern disposed between the first and second structures of the hard mask pattern, the additional pattern comprising including a portion of the light penetrable thin film and a portion the light absorbable thin film. The underlying layer is etched using the hard mask pattern and the additional pattern as an etching mask, the underlying layer being provided with an underlying pattern having a second pitch that is less than the first pitch. The light penetrable thin film is formed conformal to the first and second structures of the hard mask pattern, so that the light absorbable thin film formed over the light penetrable thin film extends below an upper surface of the hard mask pattern at a space defined between the first and second structures of the hard mask pattern.

DESCRIPTION OF SPECIFIC EMBODIMENT

FIGS. 1a through 1f are cross-sectional diagrams illustrating a method for manufacturing a semiconductor device according to an embodiment of the present invention.

Figure 1A:
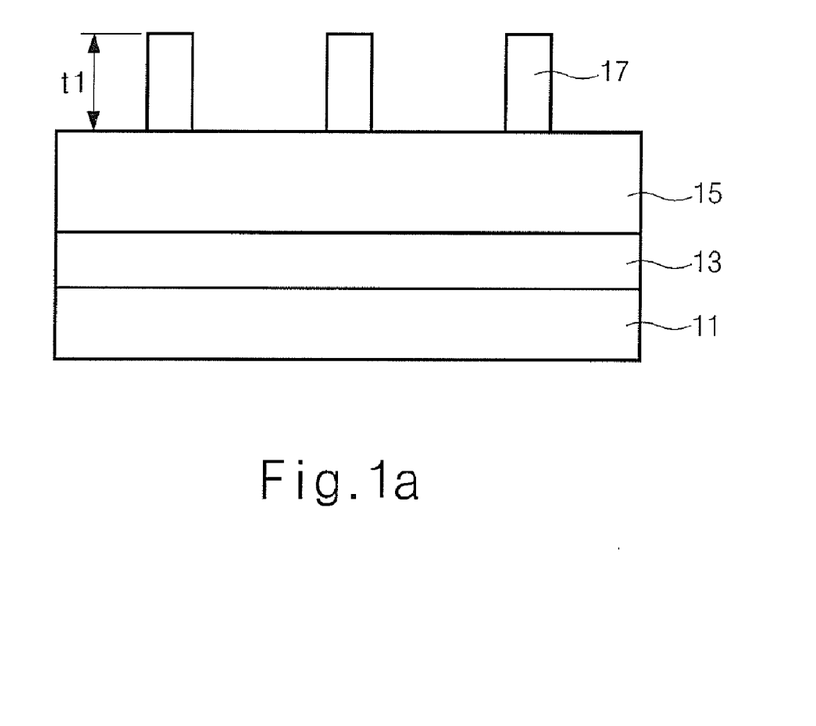
FIGS. 1a through 1f are cross-sectional diagrams illustrating a method for manufacturing a semiconductor device according to an embodiment of the present invention.

A first underlying layer 13 and a second underlying layer 15 are formed over a semiconductor substrate 11 having a lower structure (see FIG. 1a). The first underlying layer 13 and the second underlying layer 15, each may be a word line, a bit line, or a metal line.

A hard mask pattern 17 having a thickness of $t_1$ is formed over the second underlying layer 15 to have a minimum pitch (A) which is a limit of a lithography process.

The hard mask pattern 17 is formed as follows. A hard mask layer (not shown) is formed over the second underlying layer 15 to coat a photoresist film (not shown) over the hard mask layer. The hard mask layer forming material is selected from the group consisting of polysilicon, an oxide film, a nitride film, a metal, and combinations thereof. An exposure mask is located over the photoresist film. A photoresist pattern (not shown) is formed by an exposure and developing processes using the exposure mask. The hard mask layer is etched using the photoresist pattern as an etching mask to form the hard mask pattern 17. The photoresist pattern is removed thereafter.

Figure 1B:
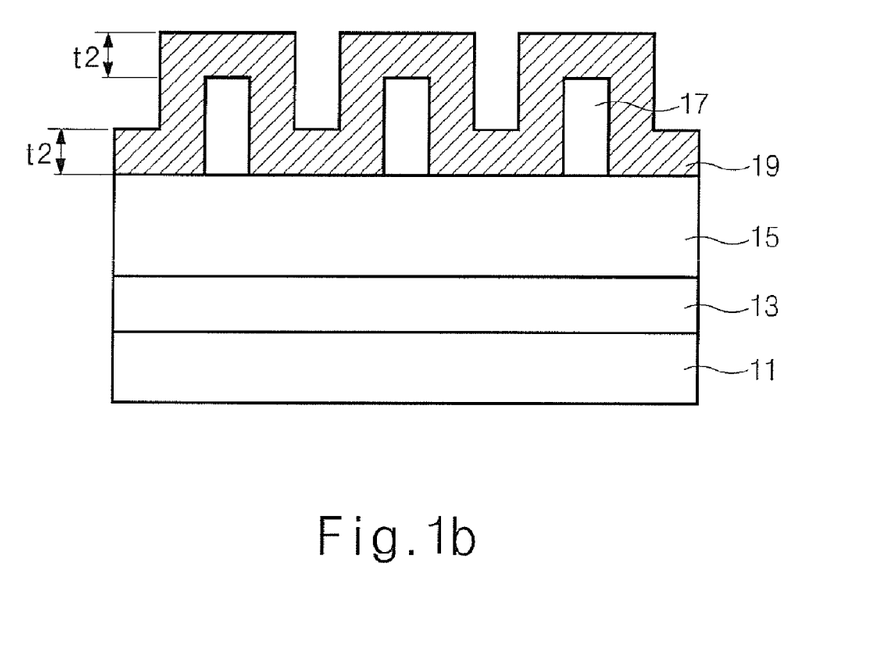

Referring to FIG. 1b, a light penetrable thin film 19 is formed in a conformal manner to have a thickness of $t_2$ over the resulting structure including the hard mask pattern 17. The light penetrable thin film 19 is formed by a composition comprising an organic polymer compound penetrable by a light of approximately 193 nm. For example, various photoresist polymers for ArF. In some embodiments, the composition comprises a photoacid generator in an amount ranging from 0.5 to 5 parts by weight and an organic solvent in an amount ranging from 1000 to 8000 based on 100 parts by weight of the organic polymer compound. The composition is spin-coated at a speed of approximately 1000 rpm to approximately 5000 rpm, and baked at approximately 90° C. to approximately 150° C. for approximately 30 seconds to approximately 180 seconds.

In some embodiments of the present invention, any of photoresist polymers for ArF can be used as the organic polymer compound. The organic polymer is poly(t-butyl acrylate/maleic anhydride/t-butyl 5-norbornene-2-carboxylate/2-hydroxyethyl 5-norbornene-2-carboxylate).

The photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate, triphenylsulfonium trifluoromethanesulfonate, and dibutylnaphthyl triplate.

The organic solvent is selected from the group consisting of methyl 3-methoxypropionate, ethyl 3-ethoxypropionate, propyleneglycol methyletheracetate, cyclohexanone, 2-heptanone, normal butanol, and ethylactate.

Figure 1C:
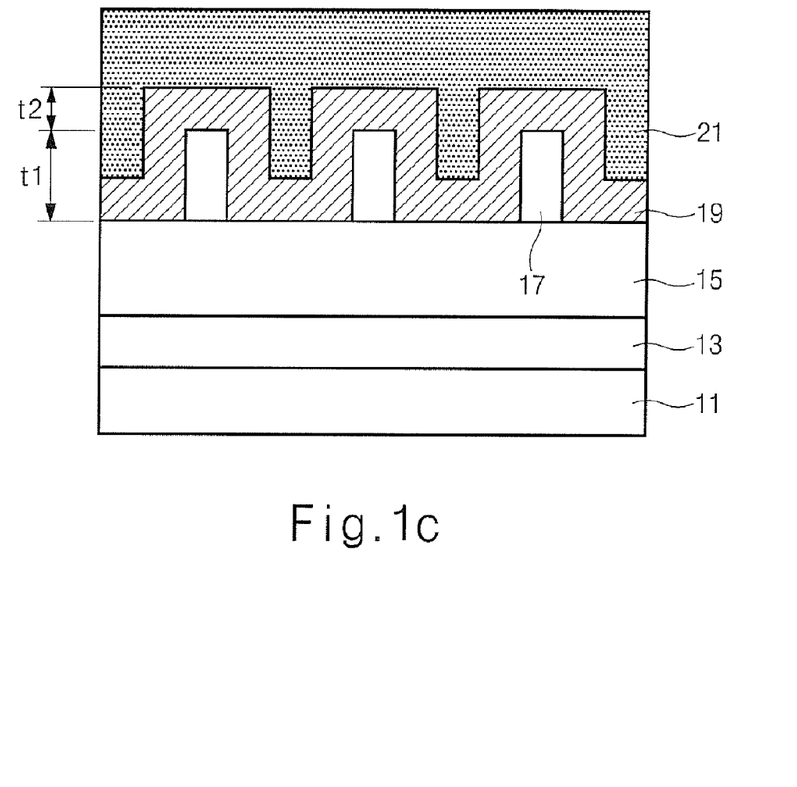

Referring to FIG. 1c, a light absorbable thin film 21 is formed over the light penetrable thin film 19. The light absorbable thin film 21 is provided with a substantially planar surface upper surface.

The light absorbable thin film 21 is formed by a composition comprising an organic polymer compound absorbable by a light of approximately 193 nm. The composition may further comprise a photoacid generator in an amount ranging from 0.5 to 5 parts by weight and an organic solvent in an amount ranging from 1000 to 8000 based on 100 parts by weight of the organic polymer compound. The composition is spin-coated at a speed of approximately 1000 rpm to approximately 5000 rpm, and baked at approximately 90° C. to approximately 150° C. for approximately 30 seconds to approximately 180 seconds.

Any of polymers including an aromatic group with a positive type which absorbs a light of approximately 193 nm can be used as the organic polymer compound. The organic polymer compound is poly(acrylic acid/2,2,3,4,4,4-hexafluorobutyl methacrylate/t-butyl acrylate/styrene). As the photoacid generator, the same material used in the light penetrable thin film 19 can be used.

In accordance with an embodiment of the present invention, the organic solvent included in the composition for forming the light absorbable thin film 21 does not dissolve the light penetrable thin film 19. The organic solvent is a $C_4$-$C_8$ alcohol compound selected from the group consisting of 1-butanol, 2-butanol, 2-methyl-1-propanol, 1-pentanol, 2-pentanol, 3-pentanol, 2-methyl-1-butanol, 3-methyl-1-butanol, 1,2-dimethyl-1-propanol, 1-hexanol, 2-hexanol, 3-hexanol, 2-methy-1-pentanol, 3-methyl pentanol, 4-methyl pentanol, 1,3-dimethylbutanol, 1,2-dimethylbutanol, heptanol, and octanol.

An exposure process without the use of an exposure mask is performed with an exposure energy ranging from approximately 10 mJ/cm² to approximately 200 mJ/cm² so that an exposure light may reach a depth T measured from a top surface of the light absorbable thin film 21 disposed over hard mask pattern 17 to a top surface of underlying layer 15, wherein $t_2 < T \leq t_1 + t_2$.

The amount of the exposure energy can be adjusted depending on exposers, and also the exposure time can be regulated depending on exposers by a person having ordinary skill in the art.

The resulting structure is baked at approximately 90° C. to approximately 150° C. for approximately 30 seconds to approximately 180 seconds. A developing process is performed with approximately 2.38 wt % TMAH aqueous solution as a developing solution.

Figure 1D:
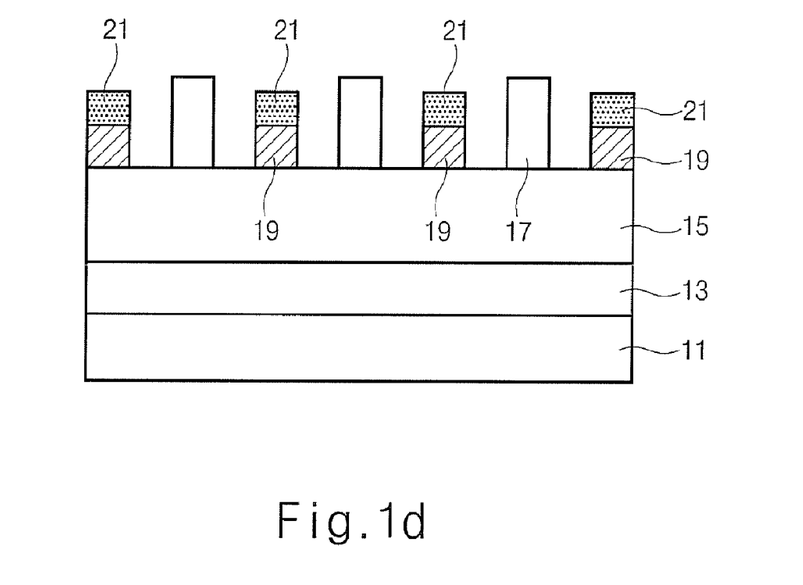

Referring to FIG. 1d, as a result of the developing process, the hard mask pattern 17 is exposed to form an organic mask pattern including the light penetrable thin film 19 and the light absorbable thin film 21 which are deposited between the hard mask patterns 17.

Meanwhile, for the process for forming the light penetrable thin film 19 and the light absorbable thin film 21, the exposure process and the developing process are repeated so that a finer pattern can be resolved.

Figure 1E:
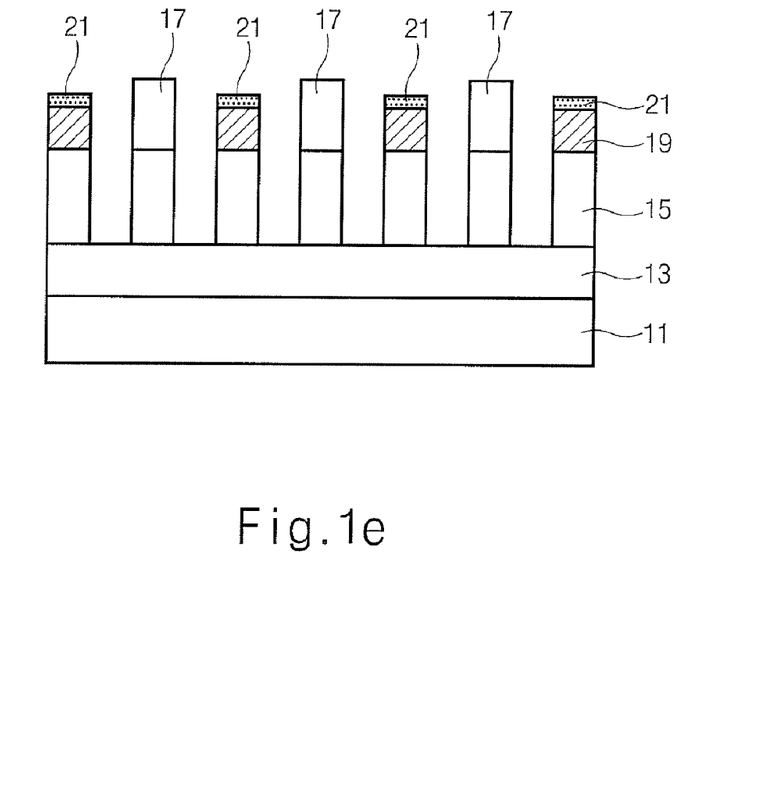

Referring to FIG. 1e, the second underlying layer 15 is etched with the hard mask pattern 17 and the organic mask pattern including the light penetrable thin film 19 and the light absorbable thin film 21 to form an underlying pattern.

In some embodiments, the underlying pattern is formed between patterns having the minimum pitch (A). A resulting pattern is formed to have a pitch (A/2) that is smaller than the minimum pitch (A). The resulting pattern has a pitch of about one half that of the minimum pitch in the present embodiment.

Figure 1F:
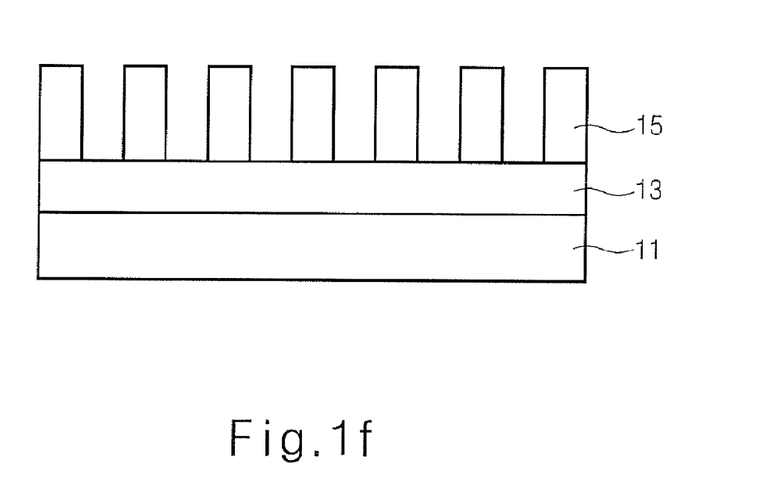

A washing process is performed to remove the organic mask pattern including the light penetrable thin film 19, the light absorbable thin film 21, and the hard mask pattern 19 over the second underlying layer 15 pattern.

SYNTHESIS EXAMPLE 1

Synthesis of an Organic Polymer Compound for Forming the Light Penetrable Thin Film 19

Synthesis of poly(t-butyl acrylate/maleic anhydride/t-butyl 5-norbornene-2-carboxylate/2-hydroxyethyl 5-norbornene-2-carboxylate)

Figure 2:
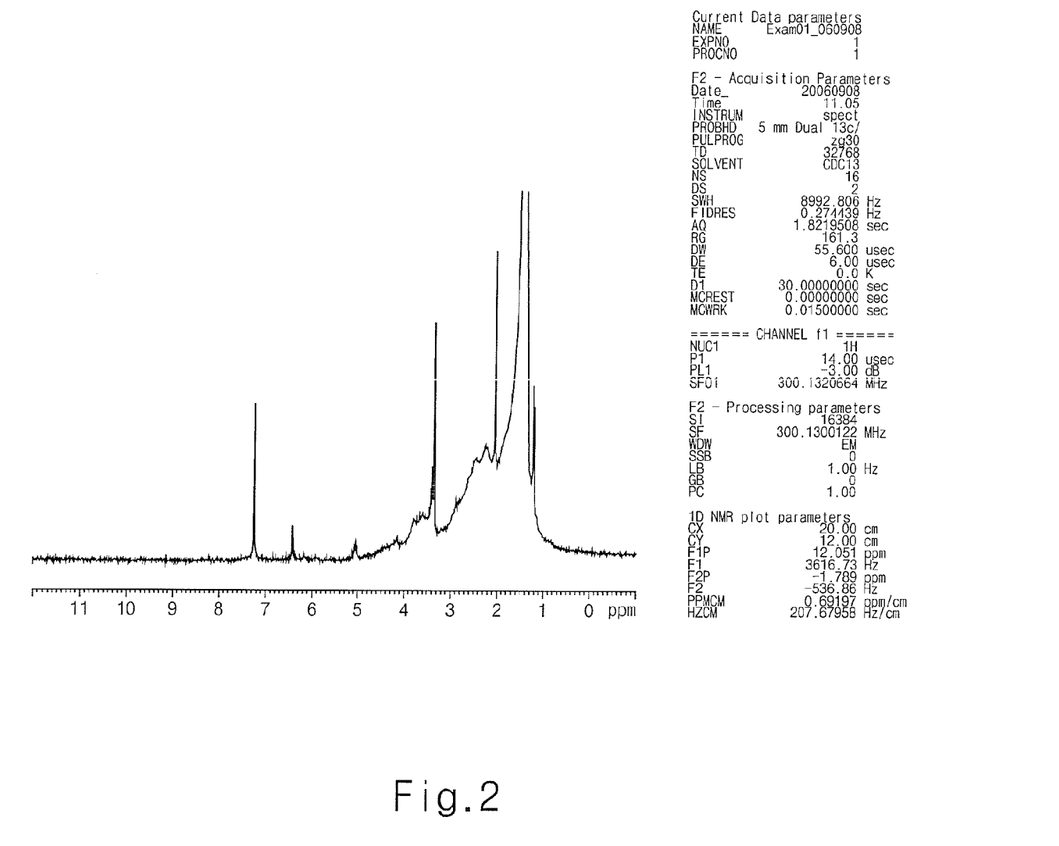
FIG. 2 is a NMR spectrum of an organic polymer compound obtained from Synthesis Example 1 in accordance with an embodiment of the present invention.

T-butyl acrylate (30 g), maleic anhydride (10 g), t-butyl 5-norbornene-2-carboxylate (12.05 g) and 2-hydroxyethyl 5-norbornene-2-carboxylate (7.47 g) were mixed with azobisisobutyronitrile (AIBN) (1.2 g) as a polymerization initiator and propyleneglycol methyl ether acetate (PGMEA) (157 g) as a polymerization solvent. The resulting mixture was reacted at approximately 67° C. for approximately 12 hours, and precipitated in normal hexane and dehydrated to obtain an organic polymer compound with yield of approximately 48% (see FIG. 2).

SYNTHESIS EXAMPLE 2

Synthesis of an Organic Polymer Compound for Forming the Light Absorbable Thin Film 21

Synthesis of poly(acrylic acid/2,2,3,4,4,4-hexafluorobutyl methacrylate/t-butyl acrylate/styrene)

Figure 3:
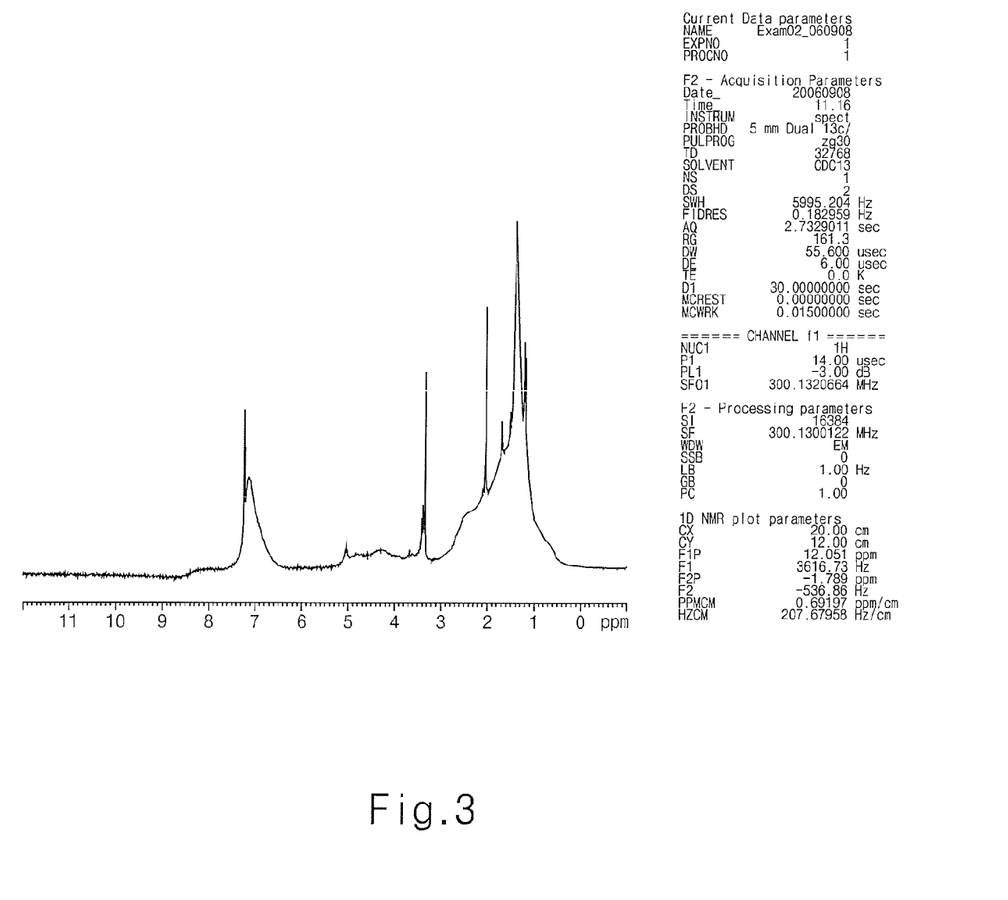
FIG. 3 is a NMR spectrum of an organic polymer compound obtained from Synthesis Example 2 in accordance with an embodiment of the present invention.

Acrylic acid (4.2 g), 2,2,3,4,4,4-hexafluorobutyl methacrylate (14 g), t-butyl acrylate (14 g) and styrene (8.26 g) were mixed with azobisisobutyronitrile (AIBN) (4 g) as a polymerization initiator and propyleneglycol methyl ether acetate (PGMEA) (145 g) as a polymerization solvent. The resulting mixture was reacted at approximately 67° C. for approximately 12 hours, and precipitated in normal hexane and dehydrated to obtain an organic polymer compound with yield of approximately 82% (see FIG. 3).

EXAMPLE 1

Formation of a Composition for the Light Penetrable Thin Film 19

The organic polymer compound (10 g) obtained from Synthesis Example 1 and triphenylsulfonium trifluoromethansulfonate (0.3 g) were dissolved in propyleneglycol methylether acetate (PGMEA) (400 g) to obtain a composition for the light penetrable thin film 19.

EXAMPLE 2

Formation of a Composition for the Light Absorbable Thin Film 21

The organic polymer compound (10 g) obtained from Synthesis Example 2 and triphenylsulfonium trifluoromethansulfonate (0.3 g) were dissolved in normal butanol (132 g) to obtain a composition for the light absorbable thin film 21.

EXAMPLE 3

Formation of a Fine Pattern

The composition obtained from Example 1 was spin-coated at approximately 2000 rpm over a semiconductor substrate including a line/space pattern having polysilicon of approximately 80 nm. The resulting structure was at approximately 130° C. for approximately 90 seconds to obtain the light penetrable thin film 19 in a conformal manner to have a thickness of approximately 50 nm.

The composition obtained from Example 2 was spin-coated at approximately 2000 rpm over the resulting structure. The resulting structure was at approximately 170° C. for approximately 90 seconds to obtain the light absorbable thin film 20 in a planar manner to have a thickness of approximately 150 nm from the light penetrable thin film 19.

Figure 4:
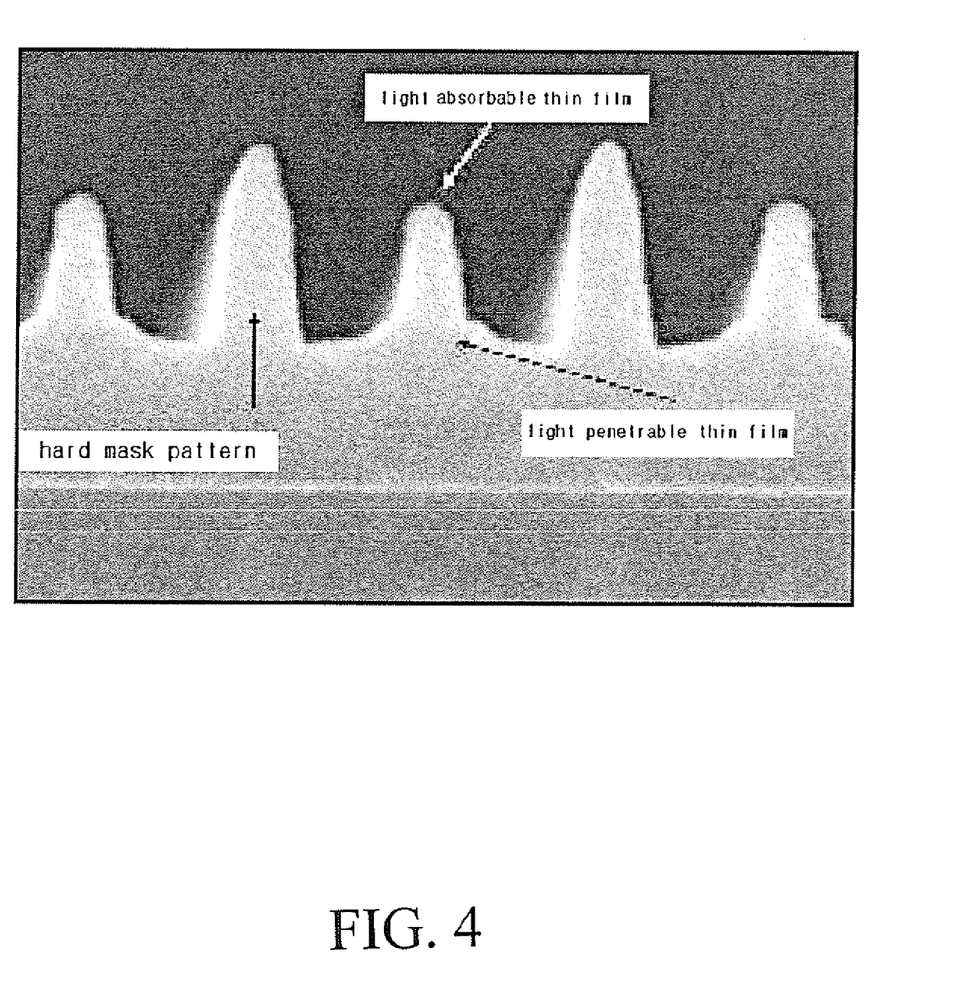
FIG. 4 is a SEM photograph of a fine pattern obtained from Example 3 in accordance with an embodiment of the present invention.

An exposure process without any exposure mask was performed on the resulting structure with an exposure energy of approximately 50 mJ/cm$^2$ using an ArF exposer. The resulting structure was baked at approximately 173° C. for approximately 90 seconds, and developed with approximately 2.38 wt % TMAH aqueous solution to obtain approximately a 50 nm fine pattern (see FIG. 4).

As described above, according to an embodiment of the present invention, a fine pattern having a pitch beyond lithography limits can be formed with an organic polymer film that has a double deposition structure by a common exposer. Moreover, the above-described method may be repeated several times to resolve a finer pattern.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:
1. A method for manufacturing a fine pattern of a semiconductor device, the method comprising:
forming a hard mask pattern having a first pitch and a thickness of $t_1$ over an underlying layer, the hard mask pattern including a first structure and a second structure, the underlying layer disposed over a semiconductor substrate;

forming a light penetrable thin film having a thickness of $t_2$ over the hard mask pattern and the underlying layer;

forming a light absorbable thin film over the light penetrable thin film, the light absorbable thin film having a substantially planar upper surface;

performing an exposure process on the light absorbable thin film, the light penetrable thin film, and the hard mask pattern without using an exposure mask, the exposure process involving controlling an amount of exposure energy such that a light reaches to a distance T from a top surface of the underlying layer so as to reach a top surface of the light penetrable thin film disposed over the hard mask pattern and leave a portion of the light absorbable film disposed over a corresponding portion of the light penetrable film unexposed, wherein $t_2 < T \leq t_1 + t_2$;

thereafter, performing a developing process to form an additional pattern disposed between the first and second structures of the hard mask pattern, the additional pattern including the corresponding portion of the light penetrable thin film and the unexposed portion the light absorbable thin film; and etching the underlying layer using the hard mask pattern and the additional pattern as an etching mask, the underlying layer being provided with an underlying pattern having a second pitch that is less than the first pitch.

2. The method according to claim 1, further comprising repeating the acts of forming a light penetrable thin film through performing a developing process at least two times.

3. The method according to claim 1, wherein the first pitch is about twice the second pitch.

4. The method according to claim 1, wherein the hard mask pattern is formed of the material selected from the group consisting of polysilicon, an oxide film, a nitride film, a metal, and combinations thereof.

5. The method according to claim 1, wherein the light penetrable thin film is formed by using a composition comprising an organic polymer compound, a photoacid generator, and an organic solvent, wherein the organic polymer compound is penetrable by a light of approximately 193 nm.

6. The method according to claim 5, wherein the forming a light penetrable thin film act further comprises:
applying the composition over a substrate; and
baking the composition at approximately 90° C. to approximately 150° C. for approximately 30 seconds to approximately 180 seconds.

7. The method according to claim 5, wherein the organic polymer compound is poly(t-butyl acrylate/maleic anhydride/t-butyl 5-norbornene-2-carboxylate/2-hydroxyethyl 5-norbornene-2-carboxylate).

8. The method according to claim 5, wherein the organic solvent is selected from the group consisting of methyl 3-methoxypropionate, ethyl 3-ethoxypropionate, propyleneglycol methyl ether acetate, cyclohexanone, 2-heptanone, n-butanol, and ethyl actate.

9. The method according to claim 1, wherein the light absorbable thin film is formed by using a composition comprising an organic polymer compound, a photoacid generator, and an organic solvent, wherein the organic polymer compound is absorbable by a light of approximately 193 nm.

10. The method according to claim 9, wherein the forming a light absorbable thin film act further comprises:
applying the composition over a substrate; and
baking the composition at approximately 90° C. to approximately 150° C. for approximately 30 seconds to approximately 180 seconds.

11. The method according to claim 9, wherein the organic polymer compound includes an aromatic group.

12. The method according to claim 9, wherein the organic polymer compound is poly(acrylic acid/2,2,3,4,4,4-hexafluorobutyl methacrylate/t-butyl acrylate/styrene).

13. The method according to claim 9, wherein the organic solvent is a $C_4$-$C_8$ alcohol compound selected from the group consisting of 1-butanol, 2-butanol, 2-methyl-1-propanol, 1-pentanol, 2-pentanol, 3-pentanol, 2-methyl-1-butanol, 3-methyl-1-butanol, 1,2-dimethyl-1-propanol, 1-hexanol, 2-hexanol, 3-hexanol, 2-methyl-pentanol, 3-methyl pentanol, 4-methyl pentanol, 1,3-dimethylbutanol, 1,2-dimethylbutanol, heptanol, and octanol.

14. The method according to claim 1, wherein the exposure process without using an exposure mask is performed with an exposure energy ranging from approximately 10 mJ/cm$^2$ to approximately 200 mJ/cm$^2$.

15. The method according to claim 1, wherein the underlying layer is formed of a material selected from the group consisting of a word line forming material, a bit line forming material, and a metal line forming material.

16. The method according to claim 1, wherein the forming a hard mask pattern act includes:
forming a hard mask layer over the underlying layer;
forming a photoresist film over the hard mask layer;
performing an exposure and developing processes on the photoresist film with an exposure mask to form a photoresist pattern;
etching the hard mask layer using the photoresist pattern as a mask to form a hard mask pattern; and
removing the photoresist pattern.

17. The method according to claim 1, wherein the light penetrable thin film is formed conformal to the first and second structures of the hard mask pattern, so that the light absorbable thin film formed over the light penetrable thin film extends below an upper surface of the hard mask pattern at a space defined between the first and second structures of the hard mask pattern.

* * * * *